United States Patent
McGinnis et al.

(10) Patent No.: US 7,661,057 B2
(45) Date of Patent: Feb. 9, 2010

(54) CLOCKING CHIEN SEARCHING AT DIFFERENT FREQUENCY THAN OTHER REED-SOLOMON (RS) ECC DECODING FUNCTIONS

(75) Inventors: Kevin W. McGinnis, Berthoud, CO (US); John P. Mead, Longmont, CO (US)

(73) Assignee: Broadcom Corporation, Irvine, CA (US)

( * ) Notice: Subject to any disclaimer, the term of this patent is extended or adjusted under 35 U.S.C. 154(b) by 445 days.

(21) Appl. No.: 11/356,812

(22) Filed: Feb. 17, 2006

(65) Prior Publication Data
US 2007/0198903 A1    Aug. 23, 2007

Related U.S. Application Data

(60) Provisional application No. 60/764,132, filed on Feb. 1, 2006.

(51) Int. Cl.
*H03M 13/15* (2006.01)
(52) U.S. Cl. ...................................... 714/784
(58) Field of Classification Search ............... 714/784, 714/789
See application file for complete search history.

(56) References Cited

U.S. PATENT DOCUMENTS

| | | | | |
|---|---|---|---|---|
| 4,845,713 A * | 7/1989 | Zook | ........................... | 714/784 |
| 5,446,743 A * | 8/1995 | Zook | ........................... | 714/784 |
| 5,699,368 A * | 12/1997 | Sakai et al. | .................. | 714/757 |
| 5,751,732 A * | 5/1998 | Im | ............................ | 714/784 |
| 5,805,617 A * | 9/1998 | Im | ............................ | 714/785 |
| 5,878,058 A * | 3/1999 | Im | ............................ | 714/784 |
| 5,912,905 A * | 6/1999 | Sakai et al. | .................. | 714/784 |
| 6,145,113 A * | 11/2000 | Baek | ........................... | 714/784 |
| 6,154,869 A * | 11/2000 | Wolf | ........................... | 714/784 |
| 6,192,497 B1 * | 2/2001 | Yang et al. | ................... | 714/781 |
| 6,263,471 B1 * | 7/2001 | Huang | ........................ | 714/784 |
| 6,279,137 B1 * | 8/2001 | Poeppelman et al. | ........ | 714/781 |
| 6,539,515 B1 * | 3/2003 | Gong | ........................ | 714/784 |
| 6,581,180 B1 * | 6/2003 | Weng | ........................ | 714/781 |
| 6,647,529 B2 * | 11/2003 | Hirofuji et al. | .............. | 714/784 |
| 6,735,737 B2 * | 5/2004 | Sankaran et al. | ............ | 714/782 |
| 6,897,791 B2 * | 5/2005 | Jaffe et al. | .................... | 341/50 |

OTHER PUBLICATIONS

Song et al., "Architectures for Decoding Adaptive Reed-Solomon Codes with Variable Block Length", IEEE Transactions on Consumer Electronics, vol. 48, Issue 3, Aug. 2002, pp. 631-637.*

* cited by examiner

*Primary Examiner*—Stephen M Baker
(74) *Attorney, Agent, or Firm*—Garlick Harrison & Markison; Shayne X. Short

(57) ABSTRACT

Clocking Chien searching at different frequency than other Reed-Solomon (RS) ECC decoding functions. An efficient implementation allows for a fast clock signal to govern the operation of the more computationally and time-intensive portions of the error correction code (ECC) time budget. For example, at least one module and/or decoding function within the ECC decoding is governed by using a first clock signal, and at least one other module and/or decoding function (or all the other modules and/or decoding functions) is/are governed by using a second clock signal. In one implementation of Reed-Solomon (RS) decoding, the Chien searching function is operated using a faster clock signal than at least one other RS error correction decoding function thereby allowing for a significant reduction in area and power than other architectural trade-offs.

20 Claims, 8 Drawing Sheets

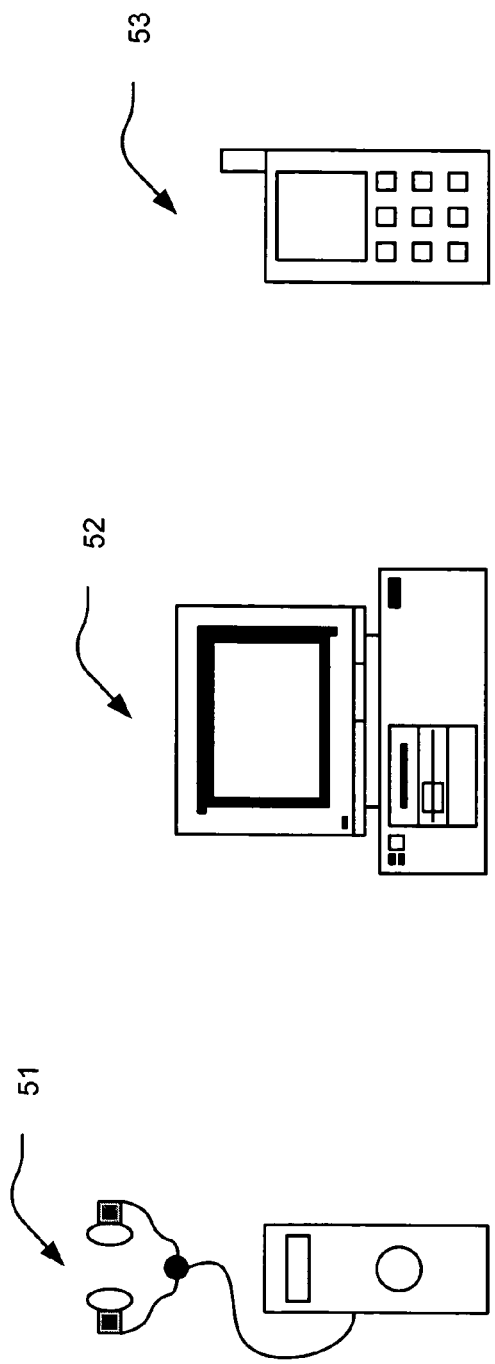
Fig. 3A
Fig. 3B
Fig. 3C
Fig. 3D
Fig. 3E

CLOCKING CHIEN SEARCHING AT DIFFERENT FREQUENCY THAN OTHER REED-SOLOMON (RS) ECC DECODING FUNCTIONS

CROSS REFERENCE TO RELATED PATENTS/PATENT APPLICATIONS

Provisional Priority Claims

The present U.S. Utility Patent Application claims priority pursuant to 35 U.S.C. § 119(e) to the following U.S. Provisional Patent Application which is hereby incorporated herein by reference in its entirety and made part of the present U.S. Utility Patent Application for all purposes:

U.S. Provisional Application Ser. No. 60/764,132, entitled "Clocking Chien searching at different frequency than other Reed-Solomon (RS) ECC decoding functions," (Attorney Docket No. BP5087), filed Feb. 1, 2006, pending.

BACKGROUND OF THE INVENTION

1. Technical Field of the Invention

The invention relates generally to memory storage devices; and, more particularly, it relates to error correction coding implemented within such memory storage devices.

2. Description of Related Art

As is known, many varieties of memory storage devices (e.g. disk drives), such as magnetic disk drives are used to provide data storage for a host device, either directly, or through a network such as a storage area network (SAN) or network attached storage (NAS). Typical host devices include stand alone computer systems such as a desktop or laptop computer, enterprise storage devices such as servers, storage arrays such as a redundant array of independent disks (RAID) arrays, storage routers, storage switches and storage directors, and other consumer devices such as video game systems and digital video recorders. These devices provide high storage capacity in a cost effective manner.

Within such hard disk drives (HDDs), error correction coding (ECC) is sometimes employed to ensure the ability to correct for errors of data that is written to and read from the storage media of a HDD. The ECC allows the ability to correct for those errors within the error correction capability of the code. In certain ECC schemes, certain of the calculations and/or processed performed during the decoding processing are much more intensive than others. One prior art approach to deal with this problem is to design a device such that efficiency can be achieved in terms of the particular architecture of the device. However, these schemes tend to be very space/area consumptive within the device, and as such, very costly. This high cost is not only in terms of the actual cost to manufacture the device, but also in terms of other performance parameters such as high power consumption. This can come at the expense of the requisite energy required for other modules and/or processes within the device. Within battery powered devices (e.g., laptop computers when operating on battery power, hand-held devices, etc.) this can be extremely deleterious in terms of performance.

There exists a need in the art for a better, more efficient means of performing error correction decoding within such devices.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWINGS

FIG. 3A illustrates an embodiment of a handheld audio unit.

FIG. 3B illustrates an embodiment of a computer.

FIG. 3C illustrates an embodiment of a wireless communication device.

FIG. 3D illustrates an embodiment of a personal digital assistant (PDA).

FIG. 3E illustrates an embodiment of a laptop computer.

DETAILED DESCRIPTION OF THE INVENTION

Figure 1:
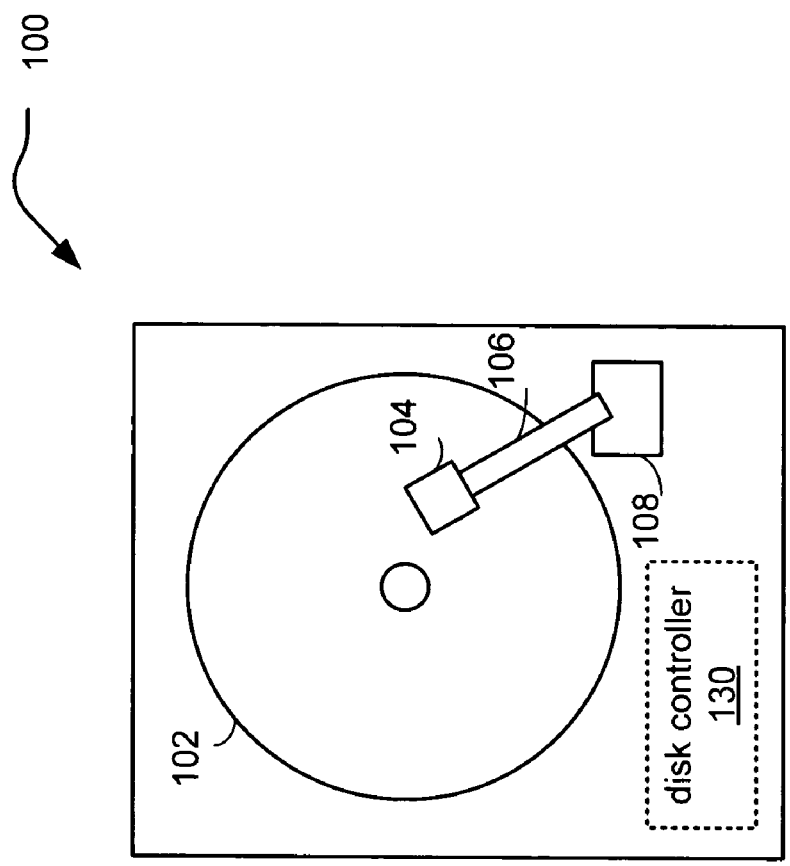
FIG. 1 illustrates an embodiment of a disk drive unit.

FIG. 1 illustrates an embodiment of a disk drive unit 100. In particular, disk drive unit 100 includes a disk 102 that is rotated by a servo motor (not specifically shown) at a velocity such as 3600 revolutions per minute (RPM), 4200 RPM, 4800 RPM, 5,400 RPM, 7,200 RPM, 10,000 RPM, 15,000 RPM, however, other velocities including greater or lesser velocities may likewise be used, depending on the particular application and implementation in a host device. In one possible embodiment, disk 102 can be a magnetic disk that stores information as magnetic field changes on some type of magnetic medium. The medium can be a rigid or non-rigid, removable or non-removable, that consists of or is coated with magnetic material.

Disk drive unit 100 further includes one or more read/write heads 104 that are coupled to arm 106 that is moved by actuator 108 over the surface of the disk 102 either by translation, rotation or both. A disk controller 130 is included for controlling the read and write operations to and from the drive, for controlling the speed of the servo motor and the motion of actuator 108, and for providing an interface to and from the host device.

Figure 2:
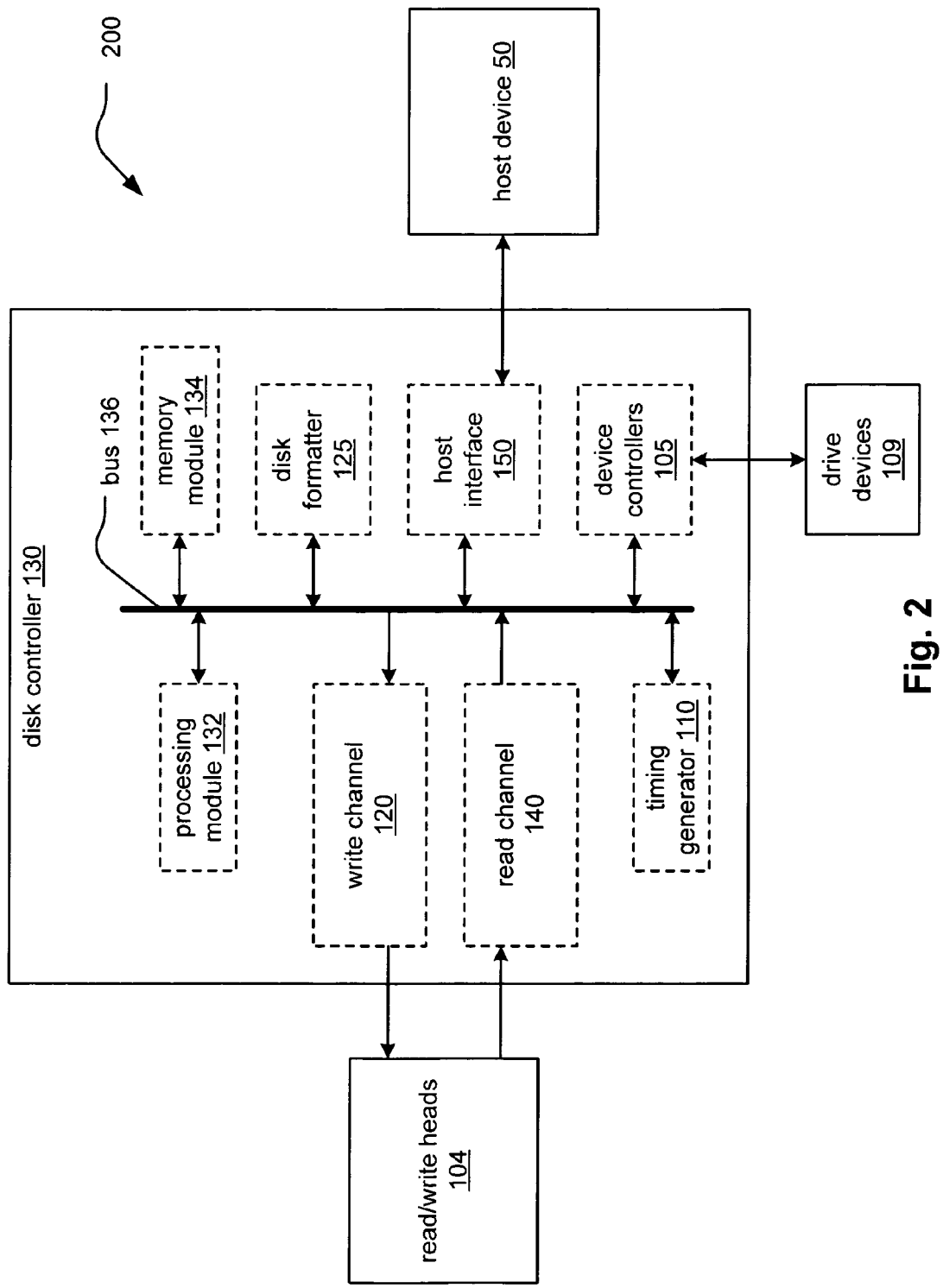
FIG. 2 illustrates an embodiment of a disk controller.

FIG. 2 illustrates an embodiment of a disk controller 130. Disk controller 130 includes a read channel 140 and write channel 120 for reading and writing data to and from disk 102 through read/write heads 104. Disk formatter 125 is included for controlling the formatting of disk drive unit 100, timing generator 110 provides clock signals and other timing signals, device controllers 105 control the operation of drive devices 109 such as actuator 108 and the servo motor, etc. Host interface 150 receives read and write commands from host device 50 and transmits data read from disk 102 along with other control information in accordance with a host interface protocol. In one possible embodiment of, the host interface protocol can include, SCSI, SATA, enhanced integrated drive electronics (EIDE), or any number of other host interface protocols, either open or proprietary, that can be used for this purpose.

Disk controller 130 further includes a processing module 132 and memory module 134. Processing module 132 can be implemented using one or more microprocessors, micro-controllers, digital signal processors (DSPs), microcomputers, central processing units (CPUs), field programmable gate arrays (FPGAs), programmable logic devices (PLAs), state machines, logic circuits, analog circuits, digital circuits, and/or any devices that manipulates signal (analog and/or digital) based on operational instructions that are stored in memory module 134. When processing module 132 is implemented with two or more devices, each device can perform the same steps, processes or functions in order to provide fault tolerance or redundancy. Alternatively, the function, steps and processes performed by processing module 132 can be split between different devices to provide greater computational speed and/or efficiency.

Memory module 134 may be a single memory device or a plurality of memory devices. Such a memory device may be a read-only memory (ROM), random access memory (RAM), volatile memory, non-volatile memory, static random access memory (SRAM), dynamic random access memory (DRAM), flash memory, cache memory, and/or any device that stores digital information. Note that when the processing module 132 implements one or more of its functions via a state machine, analog circuitry, digital circuitry, and/or logic circuitry, the memory module 134 storing the corresponding operational instructions may be embedded within, or external to, the circuitry comprising the state machine, analog circuitry, digital circuitry, and/or logic circuitry. Further note that, the memory module 134 stores, and the processing module 132 executes, operational instructions that can correspond to one or more of the steps or a process, method and/or function illustrated herein.

Disk controller 130 includes a plurality of modules, in particular, device controllers 105, processing timing generator 110, processing module 132, memory module 134, write channel 120, read channel 140, disk formatter 125, and host interface 150 that are interconnected via bus 136. Each of these modules can be implemented in hardware, firmware, software or a combination thereof, in accordance with the broad scope of the present invention. While the particular bus architecture is shown in FIG. 2 with a single bus 136, alternative bus architectures that include additional data buses, further connectivity, such as direct connectivity between the various modules, are likewise possible to implement additional features and functions.

In one possible embodiment, one or more modules of disk controller 130 are implemented as part of a system on a chip (SOC) integrated circuit. In such a possible embodiment, this SOC integrated circuit includes a digital portion that can include additional modules such as protocol converters, linear block code encoding and decoding modules, etc., and an analog portion that includes device controllers 105 and optionally additional modules, such as a power supply, etc. In an alternative embodiment, the various functions and features of disk controller 130 are implemented in a plurality of integrated circuit devices that communicate and combine to perform the functionality of disk controller 130.

FIG. 3A illustrates an embodiment of a handheld audio unit 51. In particular, disk drive unit 100 can be implemented in the handheld audio unit 51. In one possible embodiment, the disk drive unit 100 can include a small form factor magnetic hard disk whose disk 102 has a diameter 1.8" or smaller that is incorporated into or otherwise used by handheld audio unit 51 to provide general storage or storage of audio content such as motion picture expert group (MPEG) audio layer 3 (MP3) files or Windows Media Architecture (WMA) files, video content such as MPEG4 files for playback to a user, and/or any other type of information that may be stored in a digital format.

FIG. 3B illustrates an embodiment of a computer 52. In particular, disk drive unit 100 can be implemented in the computer 52. In one possible embodiment, disk drive unit 100 can include a small form factor magnetic hard disk whose disk 102 has a diameter 1.8" or smaller, a 2.5" or 3.5" drive or larger drive for applications such as enterprise storage applications. Disk drive 100 is incorporated into or otherwise used by computer 52 to provide general purpose storage for any type of information in digital format. Computer 52 can be a desktop computer, or an enterprise storage devices such a server, of a host computer that is attached to a storage array such as a redundant array of independent disks (RAID) array, storage router, edge router, storage switch and/or storage director.

FIG. 3C illustrates an embodiment of a wireless communication device 53. In particular, disk drive unit 100 can be implemented in the wireless communication device 53. In one possible embodiment, disk drive unit 100 can include a small form factor magnetic hard disk whose disk 102 has a diameter 1.8" or smaller that is incorporated into or otherwise used by wireless communication device 53 to provide general storage or storage of audio content such as motion picture expert group (MPEG) audio layer 3 (MP3) files or Windows Media Architecture (WMA) files, video content such as MPEG4 files, JPEG (joint photographic expert group) files, bitmap files and files stored in other graphics formats that may be captured by an integrated camera or downloaded to the wireless communication device 53, emails, webpage information and other information downloaded from the Internet, address book information, and/or any other type of information that may be stored in a digital format.

In a possible embodiment, wireless communication device 53 is capable of communicating via a wireless telephone network such as a cellular, personal communications service (PCS), general packet radio service (GPRS), global system for mobile communications (GSM), and integrated digital enhanced network (iDEN) or other wireless communications network capable of sending and receiving telephone calls. Further, wireless communication device 53 is capable of communicating via the Internet to access email, download content, access websites, and provide steaming audio and/or video programming. In this fashion, wireless communication device 53 can place and receive telephone calls, text messages such as emails, short message service (SMS) messages, pages and other data messages that can include attachments such as documents, audio files, video files, images and other graphics.

FIG. 3D illustrates an embodiment of a personal digital assistant (PDA) 54. In particular, disk drive unit 100 can be implemented in the personal digital assistant (PDA) 54. In one possible embodiment, disk drive unit 100 can include a small form factor magnetic hard disk whose disk 102 has a diameter 1.8" or smaller that is incorporated into or otherwise used by personal digital assistant 54 to provide general storage or storage of audio content such as motion picture expert group (MPEG) audio layer 3 (MP3) files or Windows Media Architecture (WMA) files, video content such as MPEG4 files, JPEG (joint photographic expert group) files, bitmap files and files stored in other graphics formats, emails, webpage information and other information downloaded from the Internet, address book information, and/or any other type of information that may be stored in a digital format.

FIG. 3E illustrates an embodiment of a laptop computer 55. In particular, disk drive unit 100 can be implemented in the laptop computer 55. In one possible embodiment, disk drive unit 100 can include a small form factor magnetic hard disk whose disk 102 has a diameter 1.8" or smaller, or a 2.5" drive. Disk drive 100 is incorporated into or otherwise used by laptop computer 52 to provide general purpose storage for any type of information in digital format.

When implementing ECCs within devices that include HDDs, there are typically many different types of processes that are performed during the decoding processing. Various types of ECCs can be employed including turbo coding, turbo trellis coded modulation (TTCM), parallel concatenated turbo code modulation (PC-TCM), Reed-Solomon (RS) coding, LDPC (Low Density Parity Check) coding, and/or other types of ECC.

For each of these particular types of codes, certain of these processes are more computationally intensive and require more clock cycles than others. Various aspects of the invention provide for an efficient allocation of the clock cycles, real estate, and/or overall processing capabilities of the device to provide for an overall high performance of the ECC decoding processing.

Considering one particular type of ECC, namely, RS coding, when RS ECC blocks with a hardware on-the-fly ECC system, a substantial amount of the allotted ECC correction time budget seems to be is dedicated to performing one particular function within the RS decoding processing. Perhaps the most consumptive function, in terms of the allotted ECC correction time budget, is the Chien Search operation. Looking perhaps more specifically, because a substantial portion of the ECC correction time budget is spent on performing the Chien Search function, the processing of the remaining functions within the of the RS decoding processing are squeezed into a small portion of the allotted time. This can result in excessive parallelism in the design making an on-the-fly ECC correction system consume extensive amounts of area and power. Alternately, this problem may result in an ECC architecture with additional pipeline latency. Moreover, the instantaneous power consumption may not be optimal.

In a typical implementation, one clock cycle is required per symbol of the block size. However, the Chien Search operation typically requires a minimal amount of register-to-register logic for the resulting synthesized hardware. One approach and embodiment by which efficiency can be achieved is to use multiple frequencies of the same clock signal. For example, a first clock signal can be employed to clock the Chien Search operation, and a second clock signal can be employed to clock at least one additional function within the RS decoding processing. Alternatively, this second clock signal can be employed to clock all of the remaining functions within the RS decoding processing except the Chien Search operation. In one particular embodiment, a higher rate clock signal can be employed to clock the Chien Search operation, and a lower rate clock signal can be employed to clock at least one additional function (or all of the remaining functions) within the RS decoding processing.

To ensure appropriate synchronization between these two clock signals, they can be implemented within a common clock tree network. This will help ensure that the skew of the clock signals are aligned and balanced properly. This can be achieved using clock tree synthesis modules, as is described in some of the later embodiments as well. By operating at least one function of the RS decoding processing according to one clock signal, and at least one other function (or all of the remaining functions) of the RS decoding processing according to another clock signal, the overall ECC correction time is significantly reduced. This can provide for numerous performance gains including an overall area and power reduction of the whole ECC system by providing more clocks for the remaining functions and/or reducing the number of sector pipeline stages required to perform a correction.

If desired, certain properties of the other clock signal (e.g., the second clock signal) can be dynamically modified in real time based on certain parameters. For example, the frequency of the clock signal that is used to run the Chien search function can be selected based on the amount of time remaining to complete the ECC decoding processing within the allotted ECC correction time. For example, the frequency of that clock signal can be modified, in real time, based on how close (or how far) the overall decoding processing is from the total allowed and dedicated time. Alternatively, the frequency of the clock signal that is used to run the Chien search function can be selected based on the number of errors that is identified within the particular ECC decoding processing being employed. For example, when looking at the total number of errors identified within RS decoding processing, then the frequency of the clock can be adjusted accordingly. By adjusting the frequency of the clock in response to such a parameter, the instantaneous power consumption of the device can be smoothed as well thereby providing for improved performance.

Figure 4:
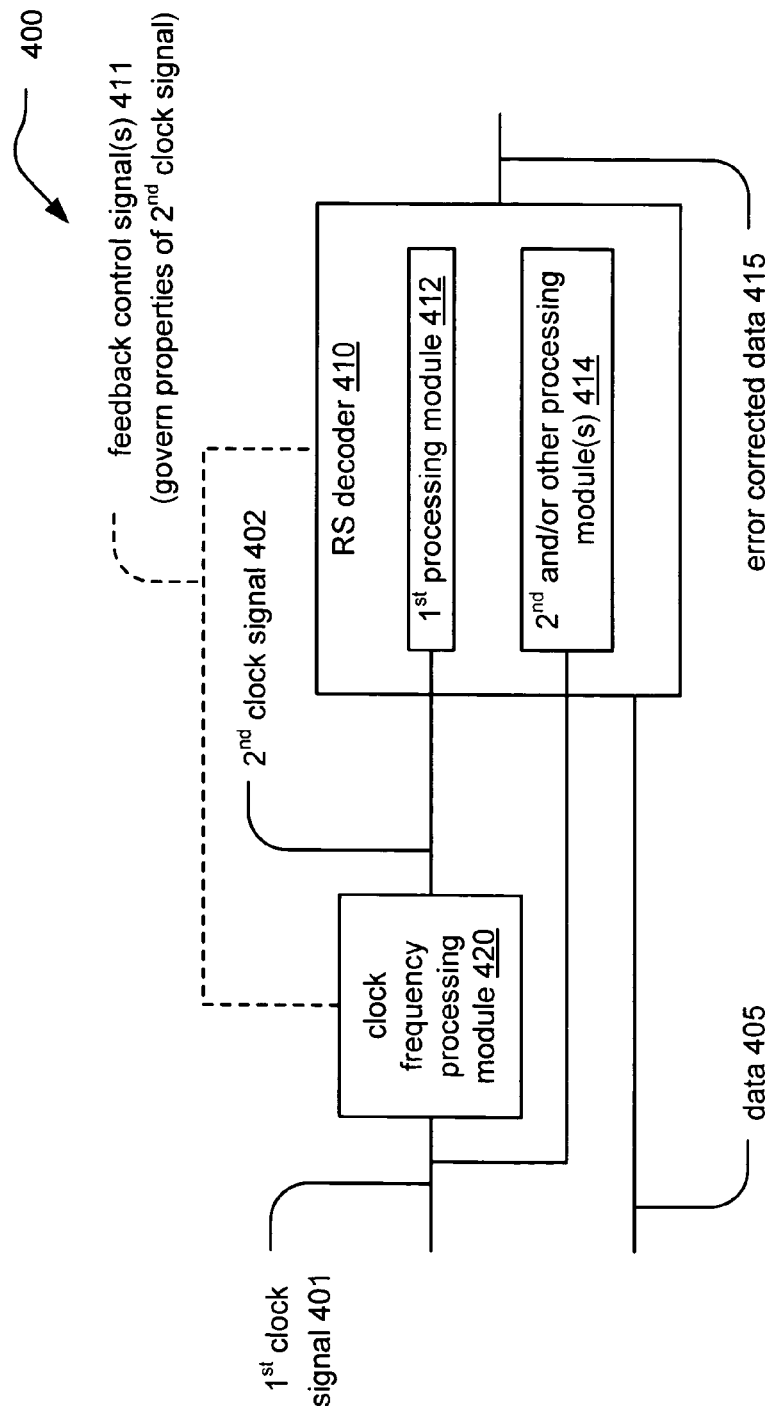
FIG. 4 illustrates an embodiment of an apparatus that includes a Reed-Solomon (RS) decoder employing two different clock signals.

FIG. 4 illustrates an embodiment of an apparatus 400 that includes a Reed-Solomon (RS) decoder employing two different clock signals. A $1^{st}$ clock signal 401 is provided to a clock frequency processing module 420. The clock frequency processing module 420 can be a divider, a multiplier, a combination thereof, and/or a module that is operable to perform any desired processing of the $1^{st}$ clock signal 401 to generate a $2^{nd}$ clock signal 402. Both the $1^{st}$ clock signal 401 and the $2^{nd}$ clock signal 402 are provided to a RS decoder 410 that is operable to perform error correction decoding processing (i.e., RS decoding processing) on data 405. Oftentimes, the data 405 are partitioned into blocks of data (e.g., ECC blocks) before or as they are received by the RS decoder 410. A $1^{st}$ processing module 412 within the RS decoder 410 receives the $1^{st}$ clock signal 401, and a $2^{nd}$ and/or other processing module(s) 414 within the RS decoder 410 receive/receives the $2^{nd}$ clock signal 402. For example, the $2^{nd}$ and/or other processing module(s) 414 can include as few as 1 processing module or as many as all of the remaining processing modules of the RS decoder 410 except the $1^{st}$ processing module 412. It is noted that although separate and distinct processing modules are depicted herein, a software and/or digital equivalent of each of these processing modules can be implemented such that each processing module corresponds to a function and/or functions that is/are performed within the RS decoding processing as well without departing from the scope and spirit of the invention.

If desired, one or more feedback signals 411 can be provided to the clock frequency processing module 420 from the RS decoder 410 to govern at least one parameter of the $2^{nd}$ clock signal 402. For example, the frequency, skew, or other parameter of the $2^{nd}$ clock signal 402 can be adjusted in response to the one or more feedback signals 411.

The RS decoder then operates the $1^{st}$ processing module 412 according to the $1^{st}$ clock signal 401, and the $2^{nd}$ processing module 414 according to the $2^{nd}$ clock signal 402 when performing RS decoding processing thereby generating error corrected data 415 from the data 405. This error corrected data includes best estimates of the information that was originally encoded using corresponding RS encoding processing.

Analogously to how the data 405 are sometimes partitioned into blocks of data (e.g. ECC blocks), the error corrected data 415 can also be provided from the RS decoder 410 as blocks of error corrected data as well.

Figure 5:
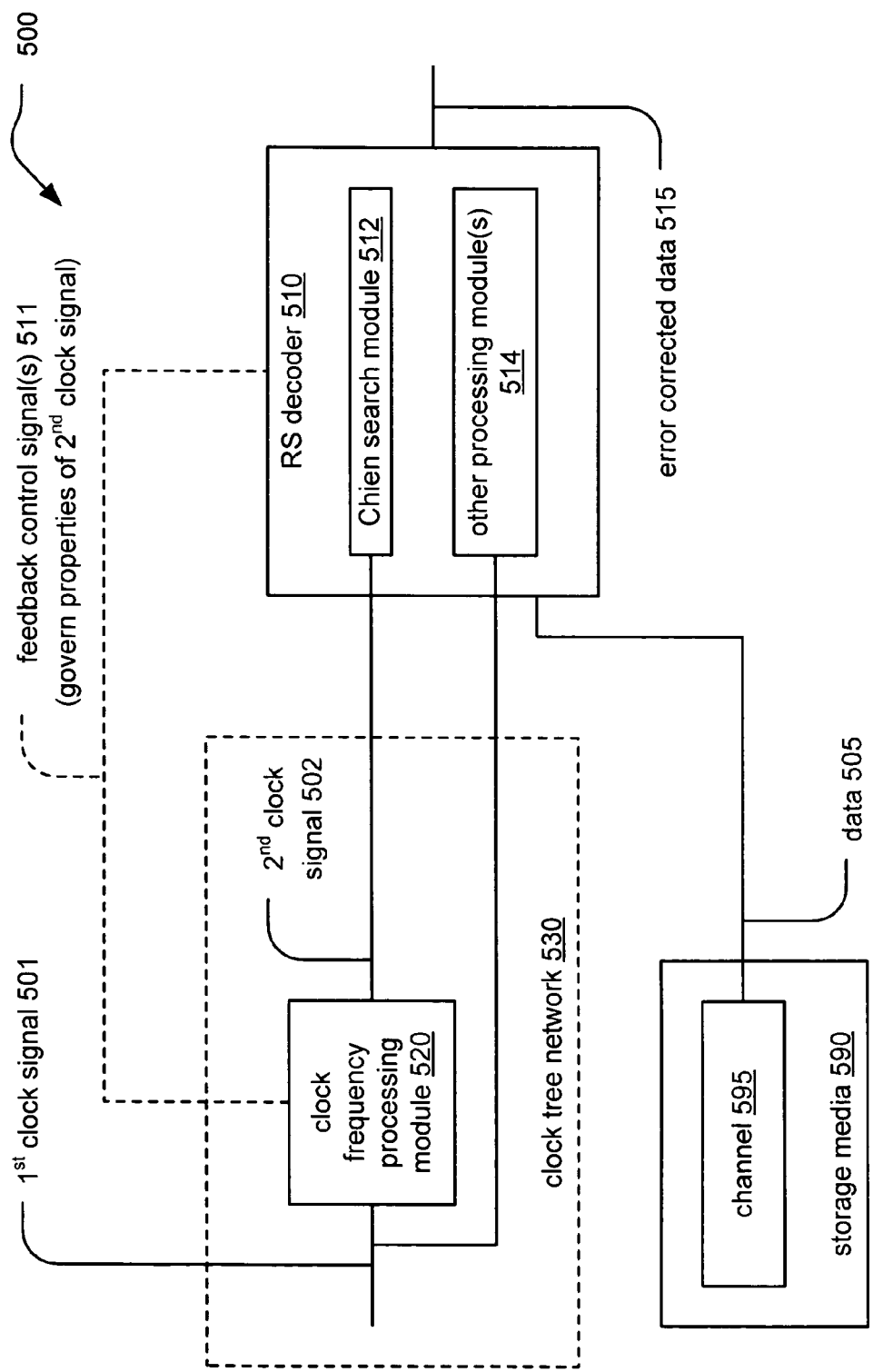
FIG. 5 illustrates an alternative embodiment of an apparatus that includes a RS decoder employing two different clock signals.

FIG. 5 illustrates an alternative embodiment of an apparatus 500 that includes a RS decoder employing two different clock signals. A $1^{st}$ clock signal 501 is provided to a clock frequency processing module 520. The clock frequency processing module 520 can be a divider, a multiplier, a combination thereof, and/or a module that is operable to perform any desired processing of the $1^{st}$ clock signal 501 to generate a $2^{nd}$ clock signal 502. It is noted that the clock frequency processing module 520 can be implemented in a clock tree network 530 such that each of the $1^{st}$ clock signal 501 and the $2^{nd}$ clock signal 502 are contained within the same clock tree network 530. By implementing each of these clock signals in a common clock tree network, the skew of each of the $1^{st}$ clock signal 501 and the $2^{nd}$ clock signal 502 will be aligned and balanced well.

Both the $1^{st}$ clock signal 501 and the $2^{nd}$ clock signal 502 (generated within a common clock tree network in some embodiments) are provided to a RS decoder 510 that is operable to perform error correction decoding processing (i.e., RS decoding processing) on data 505 that is received from a storage media 590. More specifically, the data 505 is typically retrieved via a channel 595 of the storage media 590. As mentioned within at least one other embodiment, the data 505 can be partitioned into blocks of data (e.g., ECC blocks) before or as they are received by the RS decoder 510. A Chien search module 512 within the RS decoder 510 receives the $1^{st}$ clock signal 501, and one or more other processing module(s) 514 within the RS decoder 510 receive/receives the $2^{nd}$ clock signal 502. For example, the one or more other processing module(s) 514 can include as few as 1 processing module or as many as all of the remaining processing modules of the RS decoder 510 except the $1^{st}$ processing module 412. As within other embodiments, it is noted that although separate and distinct processing modules are depicted herein, a software and/or digital equivalent of each of these processing modules can be implemented such that each processing module corresponds to a function and/or functions that is/are performed within the RS decoding processing as well without departing from the scope and spirit of the invention.

If desired, one or more feedback signals 511 can be provided to the clock frequency processing module 520 from the RS decoder 510 to govern at least one parameter of the $2^{nd}$ clock signal 502. For example, the frequency, skew, or other parameter of the $2^{nd}$ clock signal 502 can be adjusted in response to the one or more feedback signals 511.

The RS decoder then operates the Chien search module 512 according to the $1^{st}$ clock signal 501, and the one or more other processing module(s) 514 according to the $2^{nd}$ clock signal 502 when performing RS decoding processing thereby generating error corrected data 515 from the data 505. This error corrected data includes best estimates of the information that was originally encoded using corresponding RS encoding processing. Analogously to how the data 505 are sometimes partitioned into blocks of data (e.g. ECC blocks), the error corrected data 515 can also be provided from the RS decoder 510 as blocks of error corrected data as well.

In some embodiments, it is noted that the $2^{nd}$ clock signal 502 is an integer multiple of the $1^{st}$ clock signal 501. For example, the $2^{nd}$ clock signal 502 can have a frequency that is twice the frequency of the $1^{st}$ clock signal 501 in some embodiments. If desired, the $2^{nd}$ clock signal 502 can be a frequency up converted version of the $1^{st}$ clock signal 501. Alternatively, the Chien search module 512 and the one or more other processing module(s) 514 can be switched in the RS decoder 510 such that the Chien search module 512 operates according to the $1^{st}$ clock signal 501, and the one or more other processing module(s) 514 operates according to the $2^{nd}$ clock signal 502.

In such an embodiment, when desired to operate the Chien search module 512 at a higher frequency than the one or more other processing module(s) 514, the clock frequency processing module 520 could be implemented as a divider, such that the $1^{st}$ clock signal 501 (which is provided to the one or more other processing module(s) 514 in such an alternative embodiment) is an integer multiple of the $2^{nd}$ clock signal 502.

Clearly, a wide variety of permutations can be implemented such that the Chien search module 512 operates according to a $2^{nd}$ clock signal 502, and the one or more other processing module(s) 514 operates according to a $1^{st}$ clock signal 501. In some instances, the $2^{nd}$ clock signal 502 is an integer multiple of the $1^{st}$ clock signal 501.

Figure 6:
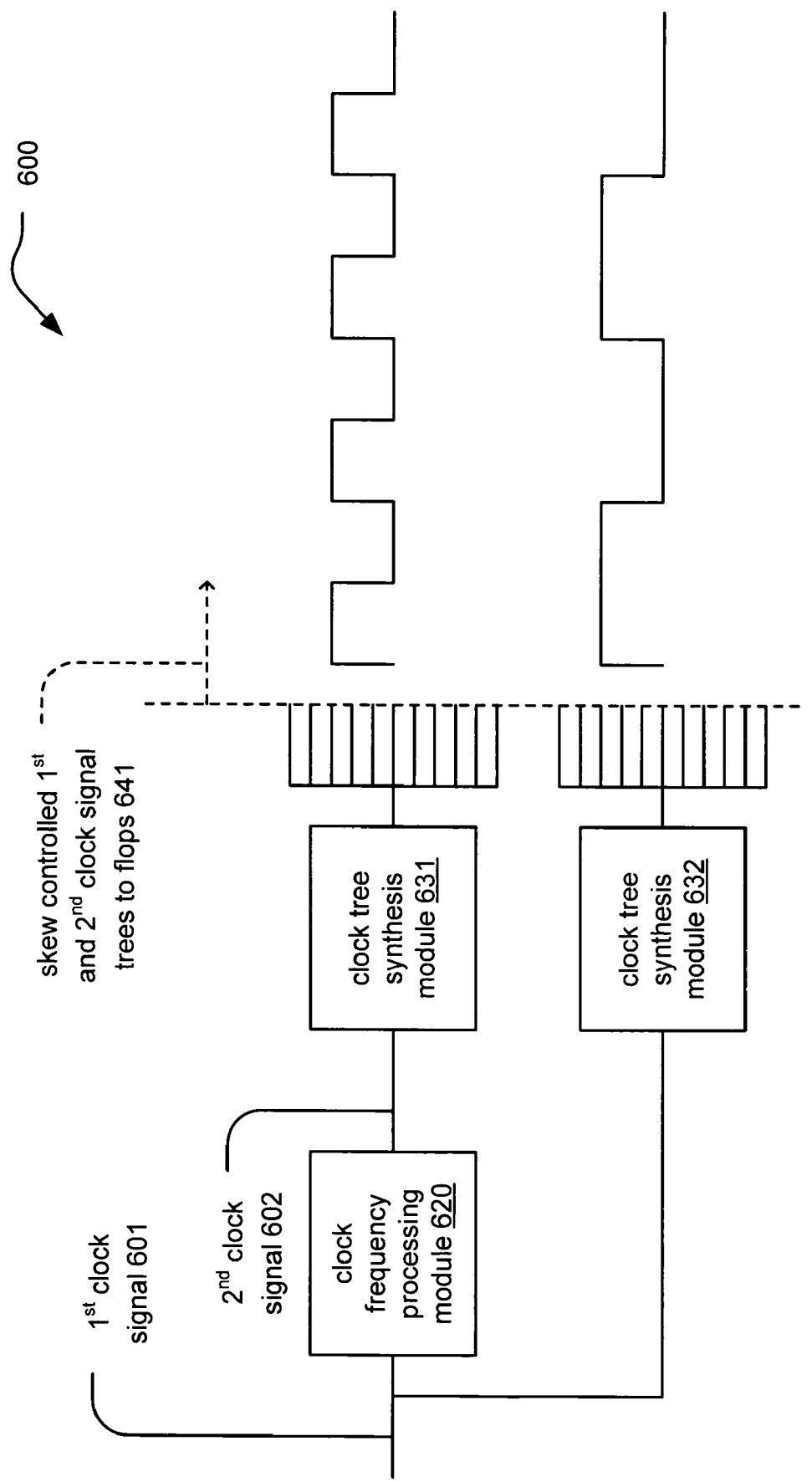
FIG. 6 illustrates an embodiment of an apparatus that employs two clock tree synthesis modules.

FIG. 6 illustrates an embodiment of an apparatus 600 that employs two clock tree synthesis modules. This embodiment shows a $1^{st}$ clock signal 601 that is provided to a clock frequency processing module 620. The clock frequency processing module 620 can be a divider, a multiplier, a combination thereof, and/or a module that is operable to perform any desired processing of the $1^{st}$ clock signal 601 to generate a $2^{nd}$ clock signal 602.

The $2^{nd}$ clock signal 602 is provided to a clock tree synthesis module 631, and the $1^{st}$ clock signal 601 is provided to a clock tree synthesis module 632. The use of the clock tree synthesis module 631 and the clock tree synthesis module 632, which can implemented within a common clock tree network (if desired), allows for the skew of the $1^{st}$ clock signal 601 and the $2^{nd}$ clock signal 602 to be aligned and balanced properly.

Subsequently, when each of the $1^{st}$ clock signal 601 and the $2^{nd}$ clock signal 602 is provided to the subsequent circuitry (e.g., flops as depicted using reference numeral 641), the skew of these signals are aligned properly such that the signals generated within each of the clock tree synthesis module 631 and clock tree synthesis module 632 have the rise times that correspond (at shown at least on the transitions that align as a function of the integral multiple difference in frequency between the two signals). In this embodiment, the clock signals generated by the clock tree synthesis module 632 from the $1^{st}$ clock signal 601 are shown as having a frequency that is one half the frequency of the clock signals generated by the clock tree synthesis module 631 from the $2^{nd}$ clock signal 602. Clearly, as desired in a particular application, any integral multiple of frequency may be employed as being the difference between the $1^{st}$ clock signal 601 and the $2^{nd}$ clock signal 602.

Figure 7:
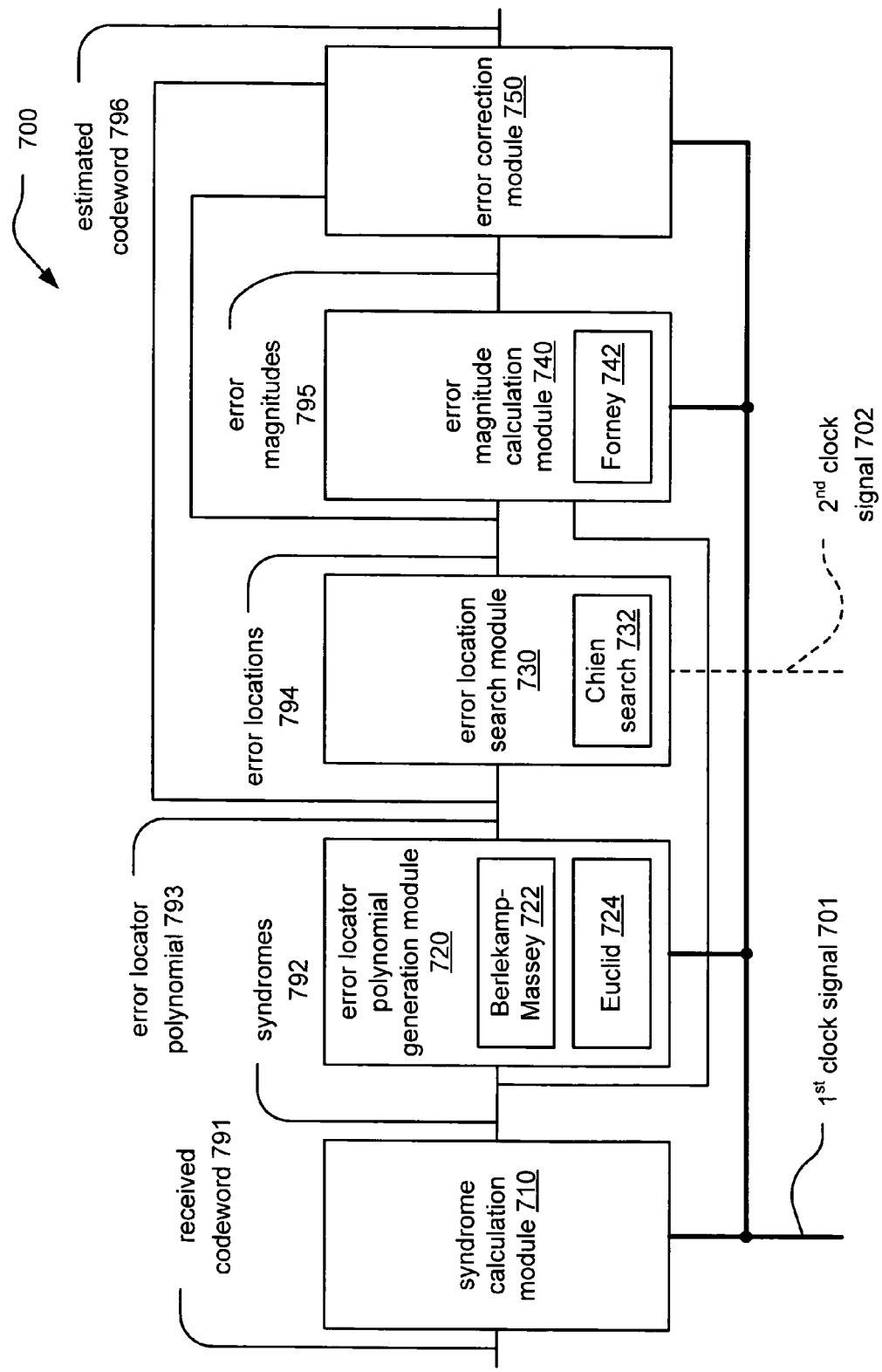
FIG. 7 illustrates an embodiment of a RS decoder that performs at least Chien searching.

FIG. 7 illustrates an embodiment of a RS decoder 700 that performs at least Chien searching. This is a general depiction of an architecture of a RS decoder 700, and it is noted that variations and/or modifications thereof may be performed without departing from the scope and spirit of the invention. At a minimum, the RS decoder includes an error location search module 730 (that can be implemented by performing Chien searching, as depicted using reference numeral 732).

A corresponding RS encoder (not shown) takes data (e.g., a block of digital data) and adds redundancy or parity bits thereto thereby generating a codeword (e.g., a codeword to be written or transmitted). This redundancy is generated as a function of the particular RS code employed. Therefore, when the data (after undergoing RS encoding) is provided to storage media, and after it is read there from, in the undesirable event that any errors occurred during either of these processes (write and/or read), hopefully the number of errors incurred is less than the error correcting capability of the RS code. The number and types of errors that can be corrected depends on the particular characteristics of the RS code employed.

Looking at FIG. 7, a received codeword 791 can be viewed as being the originally transmitted (or written) codeword plus any errors that have been incurred during the write and/or read processes to the media. In addition, perhaps some defects occurred to the actual physical surface of the storage media after the codeword has been written. This received codeword would then also include those incurred errors as well. Generally speaking, the RS decoder 700 attempts to identify the locations and magnitudes of any errors within the received codeword 791 (up to the error correcting capability of the RS code) and to correct those errors.

A syndrome calculation module 710 then processes the received codeword 791 to generate syndromes 792. The operation of the syndrome calculation module 710 is analogous and similar to the calculation of the redundancy or parity bits within the RS encoding processing. As a function of the RS code employed, a RS codeword has a predetermined number of syndromes that depend only on errors (i.e., not on the actually written or transmitted codeword). The syndromes can be calculated by substituting a predetermined number of roots (as determined by the RS code) of the generator polynomial (employed within RS encoding) into the received codeword 791.

An error locator polynomial generation module 720 then receives these calculated syndromes 792. The syndromes 792 are also passed to an error magnitude calculation module 740 (more detail of which is provided below). The error locator polynomial generation module 720 can generate the error locator polynomial 793 using various means, two of which can include the Berlekamp-Massey method 722 or Euclid method 724, as known in the art.

The error locator polynomial 793 is provided to an error correction module 750. The error locator polynomial 793 is also provided to an error location search module 730 that is operable to solve for the roots of the error locator polynomial 793. One approach is to employ the Chien search function 732. Within the overall RS decoding processing, a substantial portion of the RS decoding processing time budget is spent on performing the Chien search function 732, the processing of the remaining functions within the of the RS decoding processing are squeezed into a small portion of the allotted time.

Once the error locations 794 have been found within the error location search module 730 (i.e., using the Chien search function 732), then the error locations 794 are provided to the error magnitude calculation module 740 as well as to the error correction module 750. The error magnitude calculation module 740 finds the symbol error values, and it can employ a known approach such as the Forney method 742. Once the error locations 794 and the error magnitudes 795 are known, then the error correction module 750 corrects for them and outputs an estimated codeword 796.

Looking at this embodiment, many of the modules and/or functions within the RS decoder 700 operate using a $1^{st}$ clock signal 701, and the error location search module, in particular the Chien search function 732 located therein, operate using a $2^{nd}$ clock signal 702. In some instances, the $2^{nd}$ clock signal 702 employing by the error location search module, particularly by the Chien search function 732 located therein, is an integer multiple of the $1^{st}$ clock signal 701.

Generally speaking, it can be seen that the clock signal employed by the error location search module, particularly by the Chien search function 732 located therein, is different from the clock signal employed by at least one (and/or all of the other) modules within the RS decoder 700.

Figure 8:
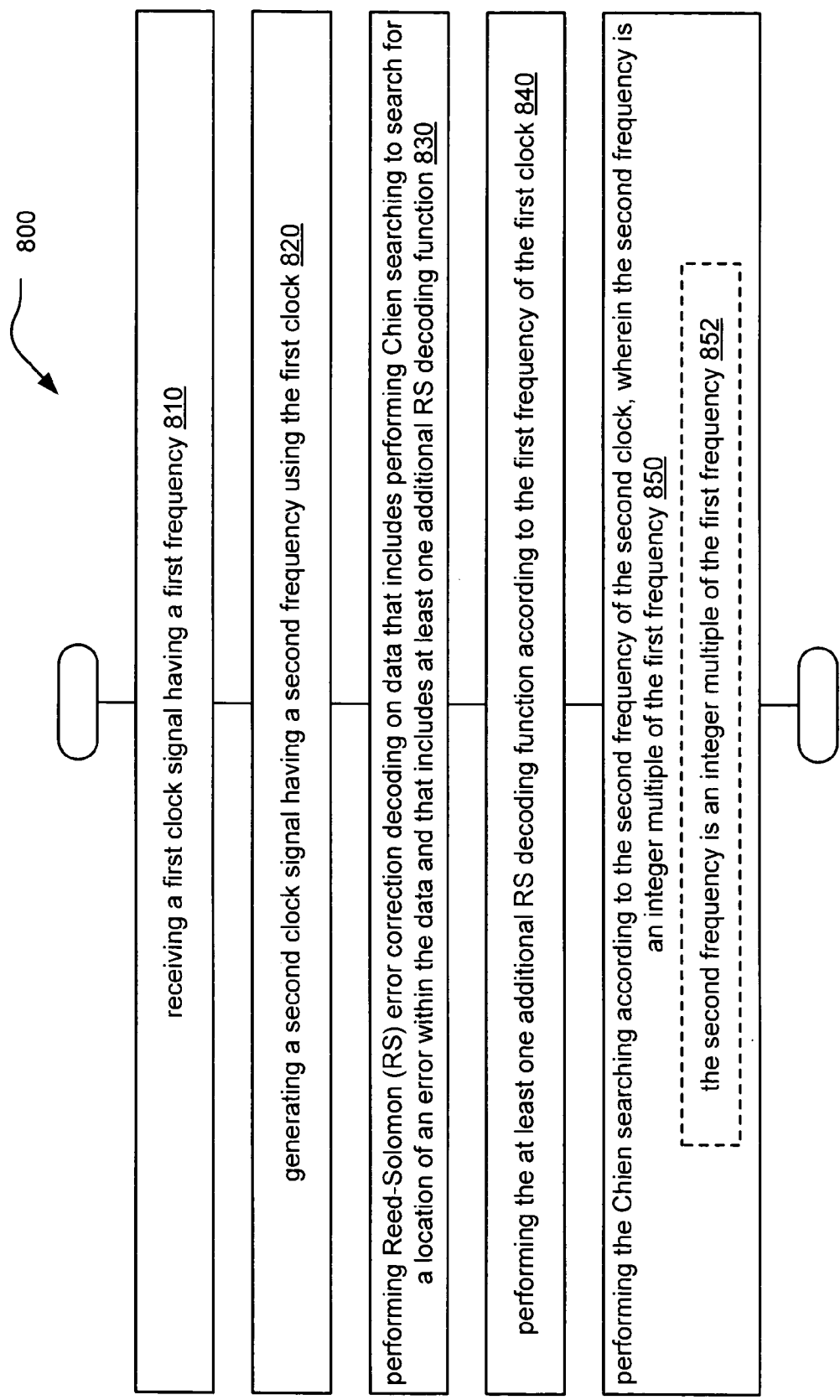
FIG. 8 illustrates an embodiment of a method that performs RS decoding.

FIG. 8 illustrates an embodiment of a method 800 that performs RS decoding. The method 800 operates by receiving a first clock signal having a first frequency as shown in a block 810. The method 800 then operates by generating a second clock signal having a second frequency using the first clock as shown in a block 820. As shown in a block 830, the method 800 continues by performing Reed-Solomon (RS) error correction decoding on data that includes performing Chien searching to search for a location of an error within the data and that includes at least one additional RS decoding function.

The method 800 also involves performing the at least one additional RS decoding function according to the first frequency of the first clock as shown in a block 840, and the method 800 also involves performing the Chien searching according to the second frequency of the second clock as shown in a block 850. In some embodiments, the second frequency is an integer multiple of the first frequency, as shown in a block 852.

In view of the above detailed description of the invention and associated drawings, other modifications and variations will now become apparent. It should also be apparent that such other modifications and variations may be effected without departing from the spirit and scope of the invention.

What is claimed is:

1. An apparatus, comprising:
    a clock frequency processing module that is operable to:
        receive a first clock signal having a first frequency; and
        generate a second clock signal having a second frequency using the first clock; and
    a Reed-Solomon (RS) decoder that is operable to perform error correction decoding on data by performing at least a first function and a second function, wherein:
        the RS decoder is operable to receive the first clock signal;
        the RS decoder is operable to receive the second clock signal;
        the first function is performed according to the first frequency of the first clock; and
        the second function is performed according to the second frequency of the second clock; and wherein:
    the second function is a Chien search function performed by the RS decoder during RS decoding processing.

2. The apparatus of claim 1, wherein:
    the second frequency is an integer multiple of the first frequency.

3. The apparatus of claim 1, wherein:
    the clock frequency processing module is operable to modify the second frequency of the second clock signal during decoding processing being performed by the RS decoder.

4. The apparatus of claim 1, wherein:
    the clock frequency processing module is operable to modify the second frequency of the second clock signal during RS decoding processing being performed by the RS decoder based on an amount of time allocated to the RS decoder for performing the first function.

5. The apparatus of claim 1, wherein:
    the clock frequency processing module is operable to modify the second frequency of the second clock signal during decoding processing being performed by the RS decoder based on a number of errors within the data as identified by the RS decoder.

6. The apparatus of claim 1, wherein:
the data are received from storage media of a hard disk drive.

7. The apparatus of claim 1, further comprising:
a clock tree network; and wherein:
the second frequency is an integer multiple of the first frequency;
the clock frequency processing module is in the clock tree network; and
the first clock signal and the second clock signal are in the clock tree network such that the first clock signal and the second clock signal are synchronized.

8. The apparatus of claim 1, further comprising:
a first clock tree synthesis module that is operable to process the first clock signal thereby generating a first plurality of clock signals, wherein:
each clock signal of the first plurality of clock signals is aligned with the other clock signals of the first plurality of clock signals; and
each clock signal of the first plurality of clock signals has a first rise time; and
a second clock tree synthesis module that is operable to process the second clock signal thereby generating a second plurality of clock signals, wherein:
each clock signal of the second plurality of clock signals is aligned with the other clock signals of the second plurality of clock signals; and
each clock signal of the second plurality of clock signals has a second rise time.

9. The apparatus of claim 1, wherein:
the apparatus is a wireless communication device.

10. The apparatus of claim 1, wherein the RS decoder further comprises:
a Chien search module that is operable to search for a location of an error within the data; and wherein
the second function is the searching for the location of the error within the data.

11. An apparatus, comprising:
a clock frequency processing module that is operable to:
receive a first clock signal having a first frequency; and
generate a second clock signal having a second frequency using the first clock;
a storage media of a hard disk drive that is operable to store data; and
a Reed-Solomon (RS) decoder that is operable to:
receive the data from the storage media of the hard disk drive;
perform error correction decoding on the data by performing at least Chien searching to search for a location of an error within the data and at least one additional RS decoding function, wherein:
the RS decoder is operable to receive the first clock signal;
the RS decoder is operable to receive the second clock signal;
the at least one additional RS decoding function is performed according to the first frequency of the first clock;
the Chien searching is performed according to the second frequency of the second clock; and
the second frequency is an integer multiple of the first frequency.

12. The apparatus of claim 11, wherein:
the clock frequency processing module is operable to modify the second frequency of the second clock signal during decoding processing being performed by the RS decoder.

13. The apparatus of claim 11, wherein:
the clock frequency processing module is operable to modify the second frequency of the second clock signal during RS decoding processing being performed by the RS decoder based on an amount of time allocated to the RS decoder for performing the at least one additional function.

14. The apparatus of claim 11, wherein:
the clock frequency processing module is operable to modify the second frequency of the second clock signal during decoding processing being performed by the RS decoder based on a number of errors within the data as identified by the RS decoder.

15. The apparatus of claim 11, further comprising:
a clock tree network; and wherein:
the second frequency is an integer multiple of the first frequency;
the clock frequency processing module is in the clock tree network; and
the first clock signal and the second clock signal are in the clock tree network such that the first clock signal and the second clock signal are synchronized.

16. The apparatus of claim 11, further comprising:
a first clock tree synthesis module that is operable to process the first clock signal thereby generating a first plurality of clock signals, wherein:
each clock signal of the first plurality of clock signals is aligned with the other clock signals of the first plurality of clock signals; and
each clock signal of the first plurality of clock signals has a first rise time; and
a second clock tree synthesis module that is operable to process the second clock signal thereby generating a second plurality of clock signals, wherein:
each clock signal of the second plurality of clock signals is aligned with the other clock signals of the second plurality of clock signals; and
each clock signal of the second plurality of clock signals has a second rise time.

17. A method, comprising:
receiving a first clock signal having a first frequency;
generating a second clock signal having a second frequency using the first clock;
receiving data from a storage media of a hard disk drive;
performing Reed-Solomon (RS) error correction decoding on the data by performing Chien searching to search for a location of an error within the data and at least one additional RS decoding function;
performing the at least one additional RS decoding function according to the first frequency of the first clock; and
performing the Chien searching according to the second frequency of the second clock, wherein the second frequency is an integer multiple of the first frequency.

18. The method of claim 17, further comprising:
modifying the second frequency of the second clock signal during the RS error correction decoding.

19. The method of claim 17, wherein:
modifying the second frequency of the second clock signal during the RS error correction decoding based on an amount of time allocated for performing the at least one additional RS decoding function.

20. The method of claim 17, further comprising:
identifying a number of errors within the data; and
modifying the second frequency of the second clock signal during the RS error correction decoding based on the number of errors identified.

* * * * *